United States Patent
Weiler et al.

(10) Patent No.: US 7,276,816 B2
(45) Date of Patent: Oct. 2, 2007

(54) HIGH-FREQUENCY MATCHING NETWORK

(75) Inventors: Manfred Weiler, Rheinbreitbach (DE); Roland Dahl, Ockenfels (DE)

(73) Assignee: CCR GmbH Beschichtungstechnologie, Rheinbreitbach (DE)

( * ) Notice: Subject to any disclaimer, the term of this patent is extended or adjusted under 35 U.S.C. 154(b) by 1012 days.

(21) Appl. No.: 10/204,743

(22) PCT Filed: Feb. 21, 2001

(86) PCT No.: PCT/EP01/01953

§ 371 (c)(1),
(2), (4) Date: Sep. 18, 2002

(87) PCT Pub. No.: WO01/63982

PCT Pub. Date: Aug. 30, 2001

(65) Prior Publication Data

US 2005/0001490 A1    Jan. 6, 2005

(30) Foreign Application Priority Data

| Feb. 24, 2000 | (DE) | ................................ 100 08 483 |
| Feb. 24, 2000 | (DE) | ................................ 100 08 484 |
| Feb. 24, 2000 | (DE) | ................................ 100 08 485 |
| Feb. 24, 2000 | (DE) | ................................ 100 08 486 |

(51) Int. Cl.
*H01F 27/42* (2006.01)
(52) U.S. Cl. ........................................ 307/104
(58) Field of Classification Search ................ 307/104; 204/298.08
See application file for complete search history.

(56) References Cited

U.S. PATENT DOCUMENTS 3,569,777 A * 3/1971 Beaudry ................. 315/111.21
6,936,144 B2 * 8/2005 Weiler et al. ........... 204/298.06

* cited by examiner

*Primary Examiner*—Robert L. DeBeradinis
(74) *Attorney, Agent, or Firm*—Cohen Pontani Lieberman & Pavane LLP

(57) ABSTRACT

The invention relates to a high-frequency matching network comprised of a primary switching circuit (1) provided with any type of capacitor (7) and with a variable capacitor (8), and of a high-frequency air-core coil (9). The high frequency matching network is also comprised of a secondary switching circuit (2) provided with any type of capacitor (5, 17), of a high-frequency air-core coil (6) and of at least one excitation electrode (3), whereby the switching circuits (1, 2) are interconnected via the inductive flux of the high-frequency air-core coils (6, 9), and the primary circuit (1) and secondary circuit (2) are additionally coupled in a capacitive manner.

30 Claims, 7 Drawing Sheets

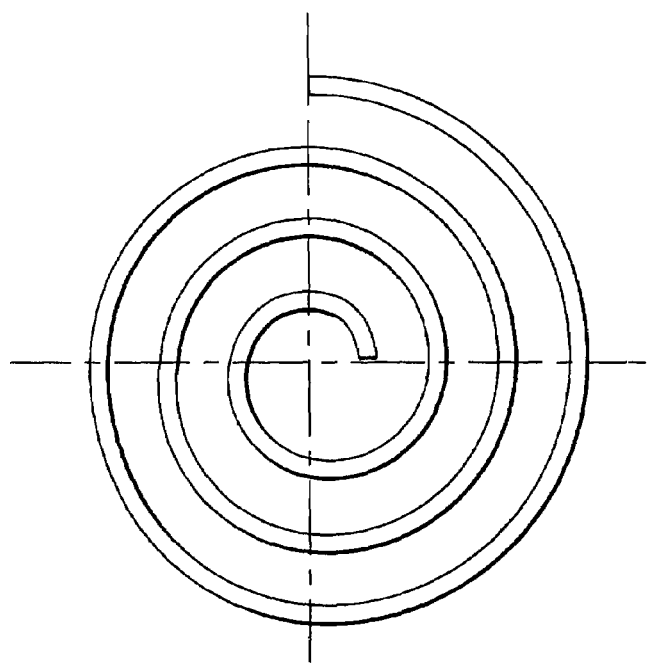 
FIG.9a  FIG.9b
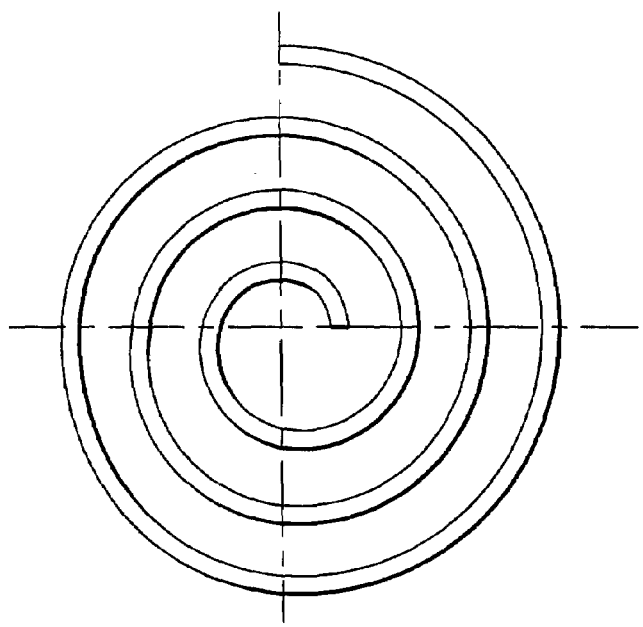 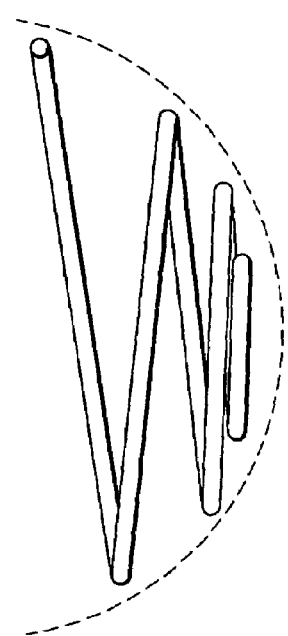
FIG.10a  FIG.10b

HIGH-FREQUENCY MATCHING NETWORK

PRIORITY CLAIM

This is a U.S. national stage of application No. PCT/EP01/01953, tiled on Feb. 21, 2001. Priority is claimed on that application and on the following application(s): Country: Germany, Application No.: 100 08 483.4, Filed: Feb. 24, 2000; Country: Germany, Application No.: 100 08 484.2, Filed: Feb. 24, 2000; Country: Germany, Application No.: 100 08 485.0, Filed: Feb. 24, 2000; Country: Germany, Application No.: 100 08 486.9, Filed: Feb. 24, 2000.

BACKGROUND OF THE INVENTION

1. Field of the Invention

The present invention is an apparatus, in the following referred to as high frequency matching network, to induce a high frequency electric alternating field into a low pressure gas discharge, in the following referred to as plasma, while simultaneously matching the load impedance to the interior resistance of a commercial high frequency generator.

2. Description of the Prior Art

Currently high frequency excited plasmas have applications in many technological areas, especially in the treatment of solid state surfaces. Thus high frequency plasmas are used for example for deposition of thin films or cleaning and etching of surfaces. When using high frequency plasmas the use of an impedance matching network is necessary as to tune the load impedance to the interior resistance of the utilized high frequency generator. Only if the load impedance is equal to the interior resistance of the generator the optimal transmittance of power from the generator to the load is possible. Generally, there is an impedance matching network between load and generator, which provides the matching of the two impedances.

According to the current state of technology matching networks for plasma excitation permit only the inductive matching of the load impedance to the interior resistance of the generator, to minimize the reflected power and hence optimize the power induced into the plasma. An alternating electrical field is coupled into the plasma by an electrode in contact with the plasma or by irradiation of the field through a dielectric medium. For the excitation efficiency of the plasma it is of special significance whether the capacitive or inductive excitation prevails. A capacitive excitation of the plasma is characterized in that the electromagnetic wave is irradiated into the plasma through its boundary and is exposed to exponential damping when expanding towards the center of the plasma. An inductive excitation is characterized in that there is a coupling of the alternating electric field with an induced alternating magnetic field inside the plasma. Generally the excitation is a mixed excitation with a capacitive and inductive fraction. At a fixed supplied high frequency power the capacitive part of the plasma coupling is determined by the voltage amplitude and the inductive part of the plasma coupling by the current amplitude is determined by the current amplitude of the alternating electric field applied to the electrode.

Rayner, Cheetham and French described in J.Vac.Sci. Technol. A 14(4) (July/August 1996), pages 2048-2055 a high frequency matching network, which consists out of two electrical circuits, which are coupled by the inductive flux of high frequency air core inductive coils.

SUMMARY OF THE INVENTION

The present invention provides a low loss high frequency matching network for plasma excitation, which allows the separate and free selection of current and voltage amplitude, simultaneously matching the load impedance to the interior resistance of a high frequency generator and thus the present invention allows a continuous adjustment between capacitive and inductive excitation of the plasma.

A high frequency matching network according to the present invention consists of a primary electrical circuit with an arbitrary and a variable capacitor and a high frequency air core inductive coil into which the power of a high frequency generator is induced, as well as a secondary electrical circuit with a fixed or a variable capacitor and a high frequency air core inductive coil and at least one excitation electrode for generation of the plasma, where the electrical circuits are coupled by the inductive flux of the high frequency air core inductive coils and are additionally coupled capacitively. When using a variable capacitor a continuous selection between capacitive and inductive plasma coupling is possible.

The degree of the capacitive coupling between primary and secondary circuit can be adjusted by one or more fixed capacitors or a variable capacitor. As capacitor can be used for example a high frequency air capacitor made of a non-noble metal with low electrical resistivity which is provided with a layer of gold or a platinum group metal, e.g. platinum, on the surface, as described in the commonly owned German patent application "Hochfrequenz-Luftkondensator" with the official application number 100 08 483.4 of the company CCR GmbH Beschichtungstechnologie. The high frequency air capacitor can be embodied as parallel plate capacitor, cylindrical capacitor or spherical capacitor. Preferably the capacitor is embodied in the shape of a trimmer, e.g. as differential air trimmer, especially with a multi linear characteristic curve, as described in the commonly owned German patent application "Differential-Luftplattentrimmer mit multi-linearer Kennlinie" with the application number 100 08 486.9 of the company CCR GmbH Beschichtungstechnologie.

Such a differential air trimmer, that enables improved matching of simple functional dependencies due to a multi linear characteristic curve (multi-linear differential air trimmer), shows contrary to linear air trimmers a combination of conventional and segmented stator discs and rotor discs. In conventional differential air trimmers stator discs and rotor discs, are similar to a 180° circle segment or a rectangular with the ratio of side lengths of 2:1, which will give the air trimmer only a linear characteristic curve. In contrast the preferred multi-linear differential air trimmer is additionally fitted with circle or rectangular segments with angles <180°. This gives this differential air trimmer a multi-linear characteristic curve, i.e. the characteristic curve is composed of two straight lines with different slopes. To exhibit a n-fold linear dependency additionally to the conventional trimmer discs additionally n−1 different segmented discs are needed. The necessary number of discs of the different segment types has to be matched to the required dependency. In general, the higher the number of different segment types the more exactly can the required dependency be approached. The characteristic curve of the preferred multi-linear differential air trimmer can thus be matched well to a simple functional dependency. Preferably the segmented rotor discs are only faced by one stator disc. The segmented stator discs do not have to face a stator side. The stator discs and/or rotor discs can be embodied as conventional 180° segments.

In case of a capacitive coupling the plasma potential with reference to ground potential can be varied by a adjusting the high frequency amplitude which alters the voltage drop across the plasma sheath. Thus, with the variation of the high frequency amplitude the energy of the ions can be adjusted as the energy of the ions is determined by the plasma potential. If instead of a common trimmer the above mentioned multi-linear differential trimmer is used, a subsequent matching of the resonance circuit by variation of the capacitive coupling due to a variation of the plasma potential is not necessary any more. Thus the ion energy can be easily adjusted with only one single trimmer. If a continuously adjustable ion energy is not demanded, the differential trimmer can be replaced by fixed capacitors.

The resonance frequency of primary and secondary electrical circuit can be matched to the generator frequency by a primary as well as by a secondary trimmer and/or by variation of the inductive coupling between primary and secondary inductive coil, especially by the variation of the axial and radial distance between the inductive coils. Additional fixed capacitors can be connected in parallel to the trimmers. Ideally the primary electrical circuit is dimensioned in such a way that high voltage amplitudes (voltage resonance) can be achieved and the secondary circuit in such a way that high current amplitudes (current resonance) can be achieved.

The high frequency air core inductive coils are in particular coolable high frequency air core inductive coils made from a non-noble material pipes with low electrical resistivity. On at least their outer surface is a layer of gold or a platinum group metal, e.g. platinum, as described in the commonly owned German patent application 100 08 484.2 of the company CCR GmbH Beschichtungstechnologie. The pipe can have an arbitrary cross section. The cross section does not necessarily have to be a circle, but can also be quadratic or rectangular. For cooling the high frequency air core inductive coil flushed with a liquid medium, preferably water. The coil can be wound in screw or spiral form, and in latter case be also spherically arched. The diameter of the coils is preferably between 10 and 100 mm To generate a current resonance in the secondary electrical circuit the total induction of the circuit should be as low as possible. The secondary inductive coil is hence reduced to a minimum of windings, preferably only one winding. To generate the voltage resonance in the primary electrical circuit the inductivity of this circuit should be as large as possible. Hence the primary inductive coil consists of many, preferably 2 to 10 windings. The diameter of the coils should be between 10 and 100 mm.

The excitation electrode for plasma generation can be situated inside as well as outside the vacuum. If the excitation electrode is situated inside the vacuum, it can be connected with the part of the secondary circuit on the atmospheric side by a vacuum current feed-through. Also the complete secondary electrical circuit, consistent of trimmer, coil, excitation electrode and connecting elements may be situated inside the vacuum, where the secondary trimmer can be adjusted with a mechanical vacuum feed through. Between the two coupling coils a dielectric window of non-magnetic and magnetic permeable material can serve to separate the vacuum from atmosphere. Such a window can be made of plastics, e.g. Teflon, or glass, e.g. quartz or window glass, as well as ceramics or aluminum oxide.

The impedance matching network according to this invention can be used in connection with all kind of and arbitrary excitation electrodes for plasma excitation. There are no restrictions regarding form, geometry, material, arrangement, number, etc. of the excitation electrode.

To obtain a large current amplitude at a fixed high frequency power, all components of the matching network have to be constructed in such a way that ohmic power losses are minimized. Generally single or all high frequency conducting components of high frequency networks, especially connecting elements, conductor paths, high frequency air core inductive coils, capacitors, vacuum current feed-throughs and excitation electrodes are composed of a metal with a low electrical resistivity. For economic reasons in general non-noble metals, e.g. copper, iron, zinc, aluminum or their alloys as e.g. brass are chosen.

At the expected frequencies of 1 to 50 MHz however, the current flows only in the surface of the conductors across a surface layer with a thickness of a few micro meters due to the skin effect. In conventional conducting materials, as e.g. copper, the surface of the conductor reacts due to the contact with oxygen or nitrogen of air to form an oxide or nitride layer, which reduces the conductivity at the surface of the conductor considerably and thus increases the ohmic loss of the high frequency power considerably. It should be ensured that the surface of the conducting materials remains highly conductive. This is ensured by depositing single or all high frequency conducting components at least on their outer surface with a layer of gold or a platinum group metal, e.g. platinum.

If noble metals, for example gold or platinum, are deposited on non-noble metals, for example copper or brass, there is a danger that the noble metal diffuses into the non-noble metal or the non-noble metal diffuses into the noble metal. Subsequently the conductivity on the surface decreases due to the above mentioned reasons. The diffusion process can be prevented with the deposition of a diffusion barrier, for example a very thin layer of nickel, which is deposited onto the non-noble metal before deposition of the gold or platinum group metal. Thus the long time stability of the outer metal layer is ensured. Both layers can be deposited by plasma chemically or galvanically, preferably as a closed layer of a thickness of 10 nm to 10 μm, preferably 1 μm.

Both layers, i.e. the diffusion barrier and the deposited layer of gold or platinum group metal on top, are also described in detail in the commonly owned German patent applications "Kühlbare Hochfrequenz-Luftspule" with the application number 100 08 484.2, as well as "Hochfrequenz-Luftkondensator" with the application number 100 08 483.4 of the company CCR GmbH Beschichtungstechnologie.

Single or all high frequency conducting components of the matching network can be cooled with a liquid medium, preferably water.

This invention of the matching network, which can be used for the generation of a quasi neutral plasma beam or ion beam, enables an optimization of the inductive coupling, which increases the excitation efficiency significantly. Also it enables the exploitation of special resonance excitations such as electron cyclotron wave resonance or Landau damping resonance.

The high frequency matching network described in this invention can for example be used in a high frequency plasma source or ion source as described in the German patent application "Hochfrequenz Plasmaquelle" with the application number 100 08 482.6 of the company CCR GmbH Beschichtungs-technologie.

BRIEF DESCRIPTION OF THE DRAWINGS

In the drawings, wherein like reference characters denote similar elements throughout the several views:

FIGS. 9a and 9b are front and side views of a high frequency air core inductive coil; and FIGS. 10a and 10b show a spiral wound and spherically aired high frequency air core inductive coil.

DETAILED DESCRIPTION OF THE PREFERRED EMBODIMENTS

Figure 1:
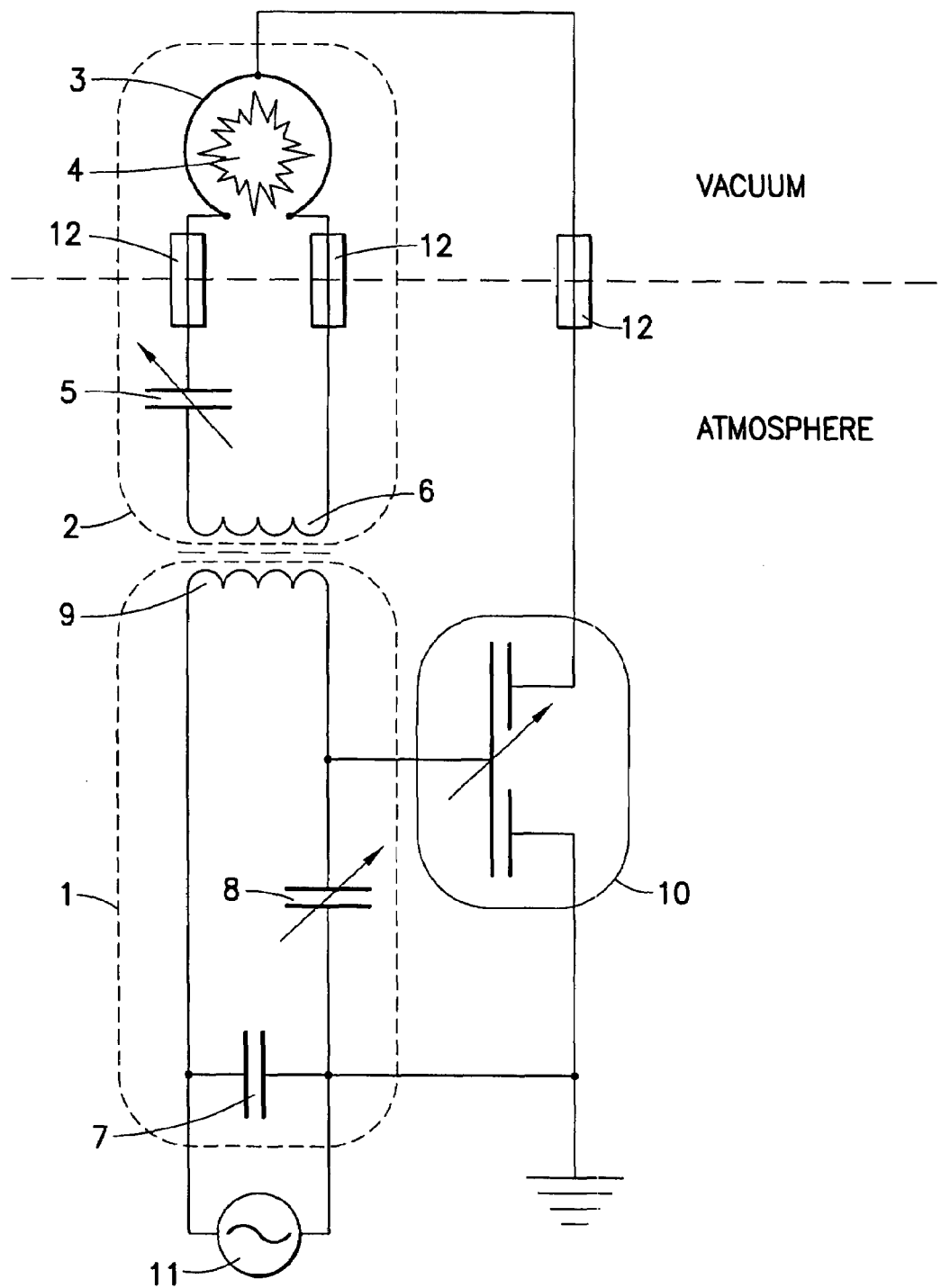
FIG. 1 is a schematic diagram of an impedance matching network according to an embodiment of the present invention.

The connection of the matching network in FIG. 1 consists of two coupled oscillating circuits, namely a primary circuit 1 and a secondary circuit 2. The power supplied by a high frequency generator 11 is induced into the primary circuit 1. An excitation electrode 3 is arranged inside a vacuum to excite the plasma. The excitation electrode 3 is connected with the secondary circuit 2 by two vacuum current feed-throughs 12. The coupling of the two electrical circuits 1,2 takes place inductively by means of a transmitter consisting of primary and secondary high frequency air core inductive coils 9, 6, and capacitively by means of a differential trimmer 10. The primary electrical circuit 1 consists of the primary inductive coil 9, an arbitrary (i.e., fixed or variable) capacitor 7 and a variable capacitor (primary trimmer) 8. The capacitor 7 is connected in parallel to the exit of the high frequency generator 11; generally one pole of the high frequency generator 11 is connected to ground potential. Also parallel to the output of the high frequency generator 11 is a serial connection of primary trimmer 8 and primary inductive coil 9, where the primary trimmer is connected with the grounded pole of the high frequency generator 11. The secondary electrical circuit consists of a serial connection of the secondary inductive coil 6, a variable capacitor (secondary trimmer) 5 and the excitation electrode 3. The central pole of the differential trimmer 10 is connected between the primary inductive coil 9 and the primary trimmer 8. The side poles of the differential trimmer 10 are respectively held at ground potential and connected with the central pole of the excitation electrode 3. If necessary, additional fixed capacitors can be connected in parallel to all trimmers.

Figure 2:
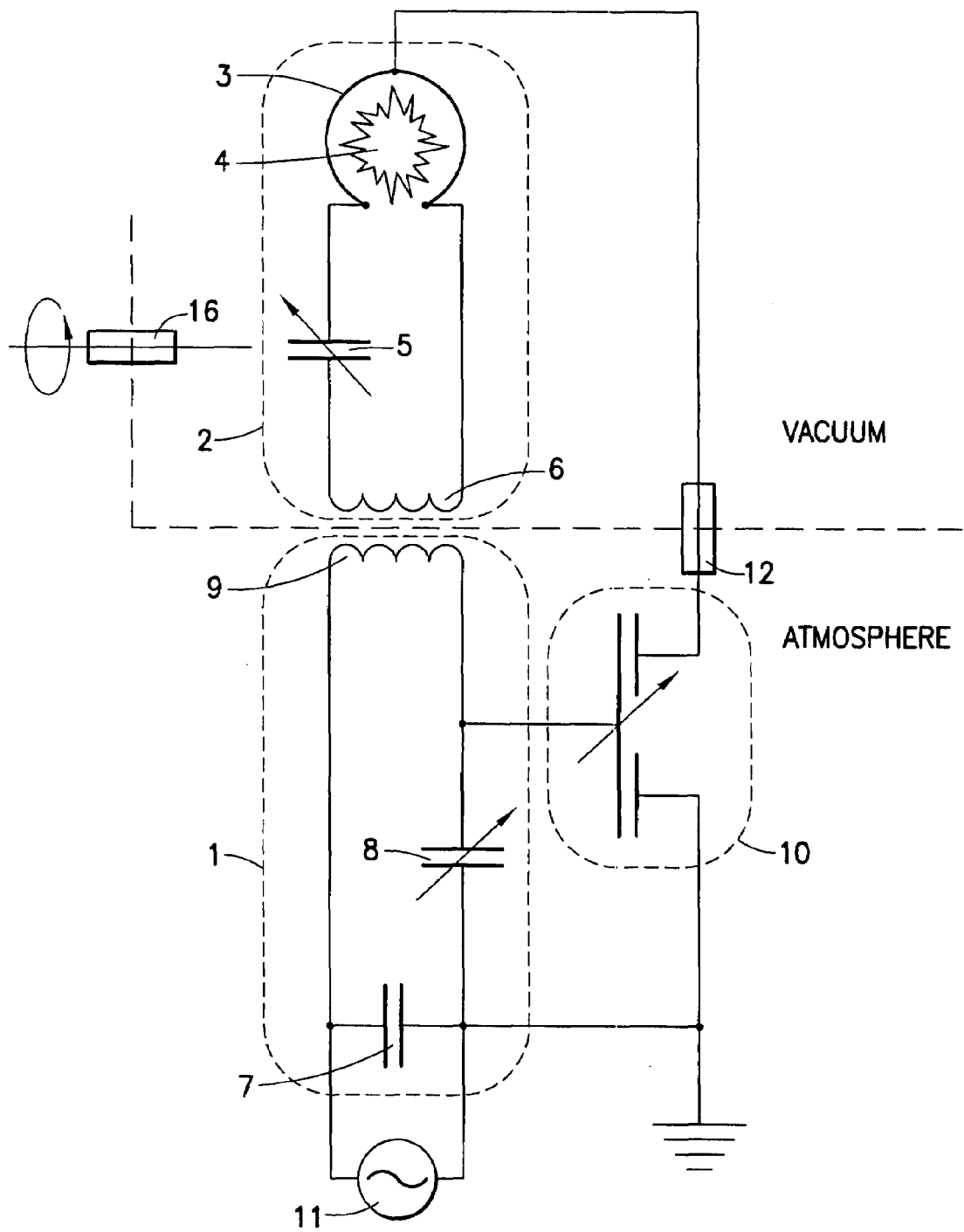
FIG. 2 is a schematic diagram of impedance matching network according to another embodiment of the present invention.
Figure 3:
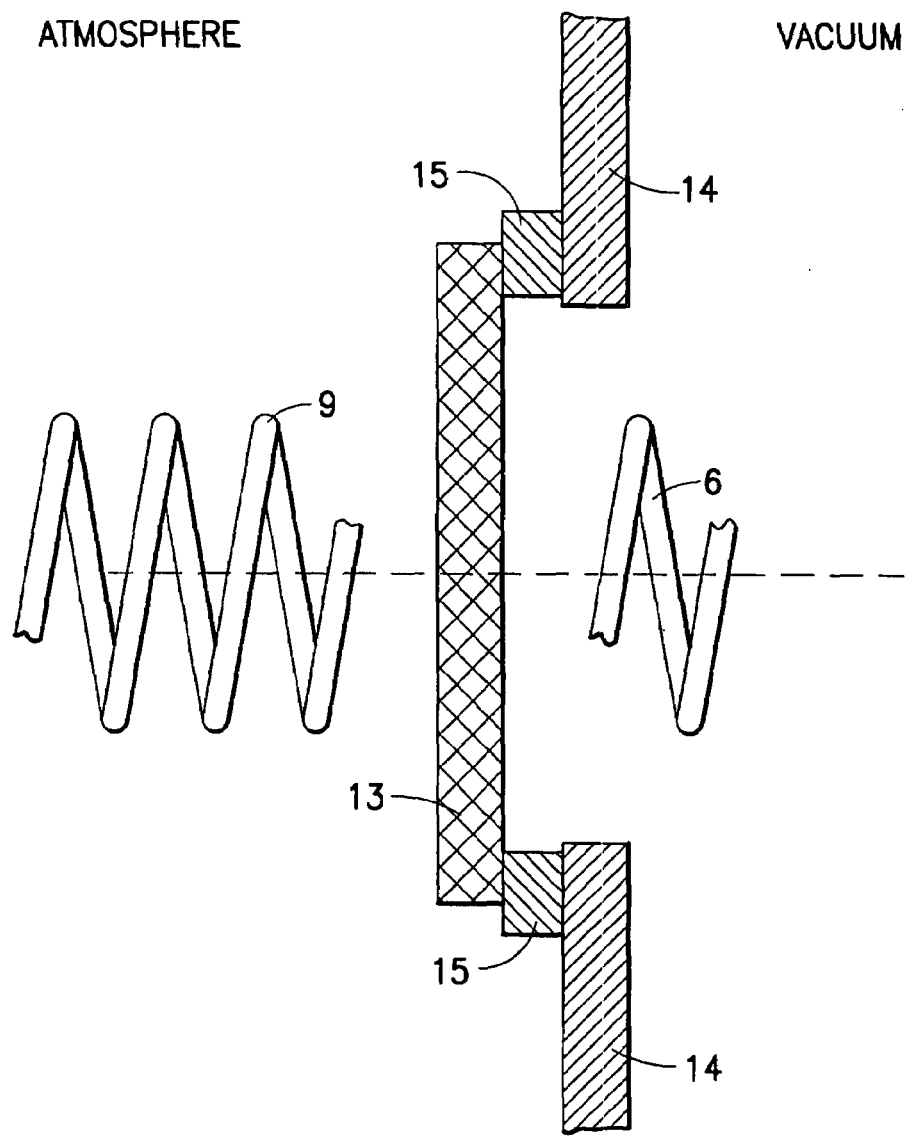
FIG. 3 is a sectional view of a boundary for transmitting an alternating electrical field into a vacuum.

FIG. 2 shows a variation of the matching network illustrated in FIG. 1, in which the complete secondary circuit 2 is placed inside the vacuum. The boundary between vacuum and atmosphere is in between the primary and secondary air core inductive coils 6, 9, of the primary and secondary circuit which are coupled by the inductive flux. To separate vacuum and atmosphere a dielectric window 13 is used (FIG. 3), which does not discontinue the inductive flux between the two coupling inductive coils 6, 9. Between the window 13 and the back wall of the plasma chamber 14 there is a vacuum gasket 15. The matching of the secondary circuit with the secondary trimmer 5 is then enabled by means of a mechanical vacuum feed-through 16.

Figure 4:
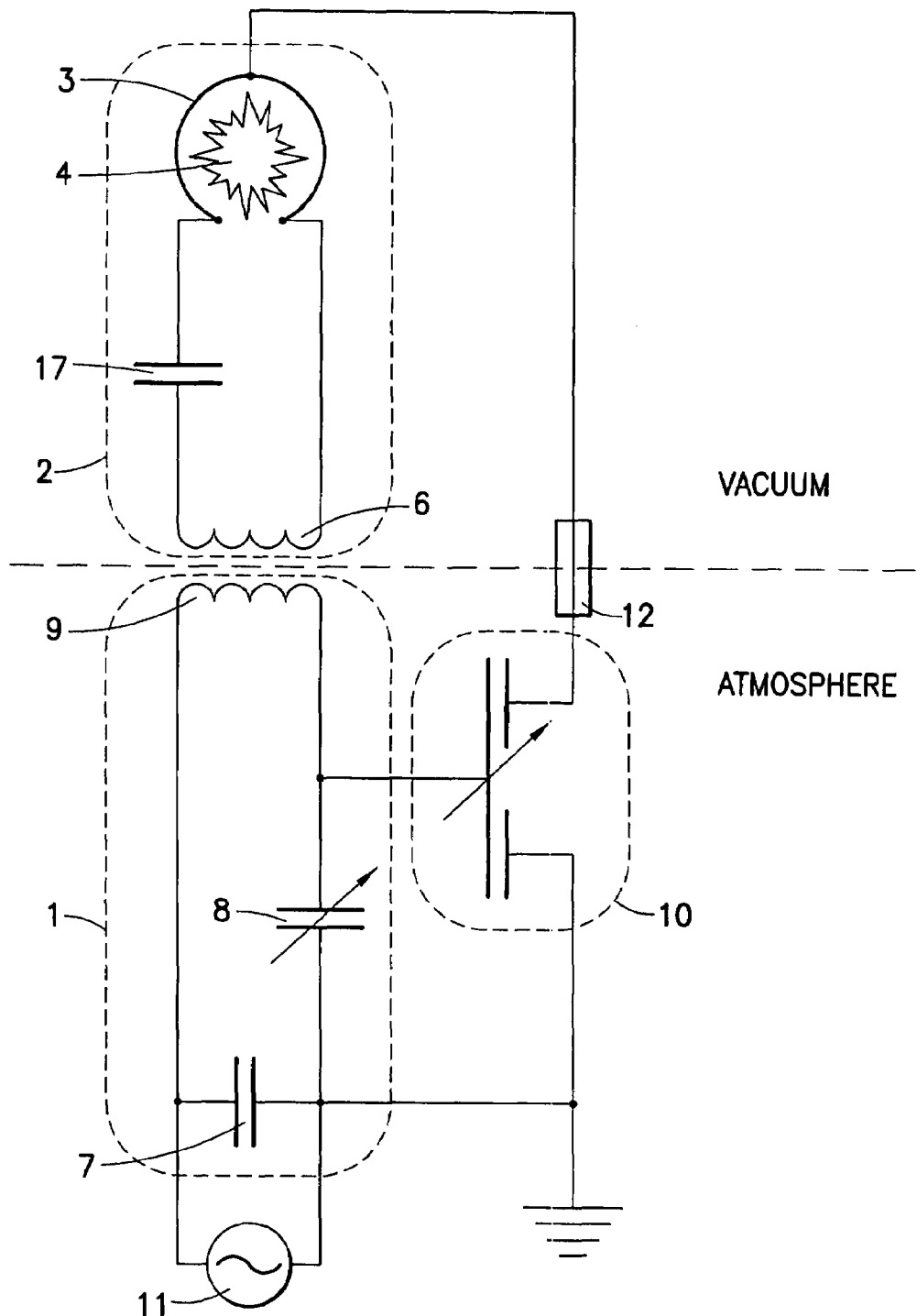
FIG. 4 is a schematic diagram of an impedance matching network according to another embodiment of the present invention.

FIG. 4 shows a further embodiment of the matching network, in which the secondary trimmer 5 of FIGS. 1 and 2 is replaced by a fixed capacitor 17. In this case the matching of the resonant circuit is done by adjustment of the primary trimmer 8 and by adjustment of the inductive coupling between primary and secondary inductive coil 9, 6. For the latter the radial and axial distance between primary coil 9 and secondary coil 6 can be varied as the components of the atmospheric part of the matching network are mounted in bearings and hence movable. The movable and fixed components of the primary circuit are connected by flexible conductor paths or high frequency cables.

Figure 5:
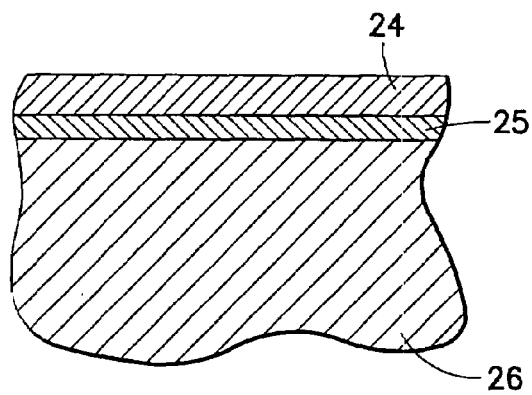
FIG. 5 is a partial sectional view of a high frequency conducting component for use in the present invention.

FIG. 5 shows layers of high frequency conducting components of the matching network. The basis material of the components (26) is covered with a closed layer of nickel (25) which acts as diffusion barrier. On top of the nickel layer a layer of gold (24) is deposited.

Figure 6:
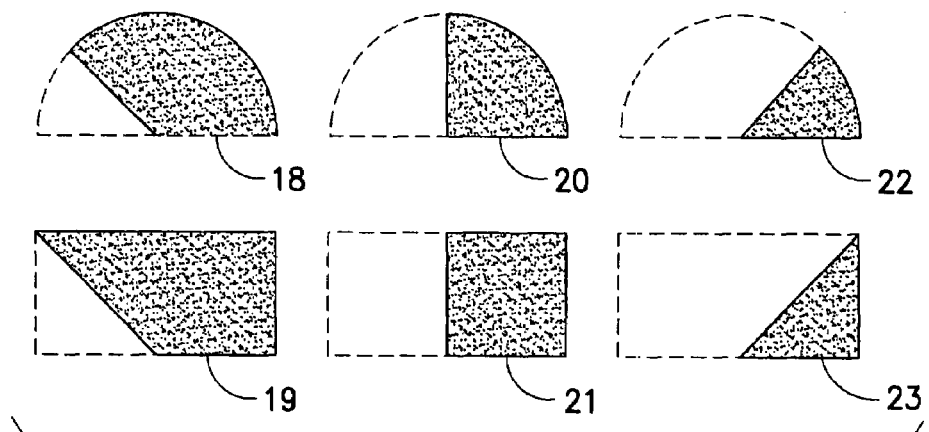
FIG. 6 is a view showing segmented stator or rotor plates for use in a trimmer of the present invention.

FIG. 6 shows a selection of segmented trimmer discs of a differential air trimmer with a multi linear characteristic curve. The illustrated 135° segments 18, 19, the 90° segments 20, 21, and the 45° segments 22, 23 are, additionally to the conventional trimmer discs, necessary to obtain a multi-linear dependency.

Figure 7:
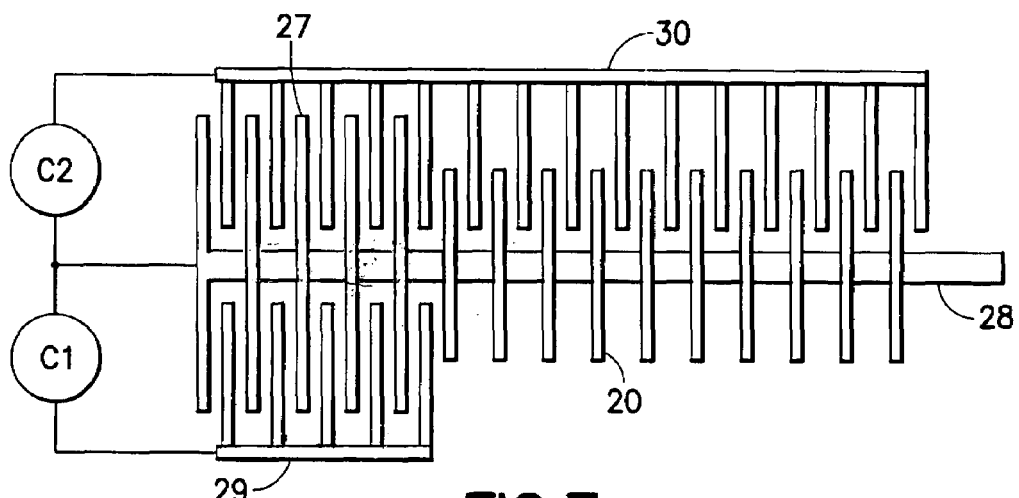
FIG. 7 is a schematic diagram of a double-linear differential trimmer for use in the present invention.

FIG. 7 shows a double linear differential trimmer as exemplary embodiment of a multi linear differential air trimmer. It consists of a revolving axle 28, to which a rotor is attached. The rotor consists of five conventional 180° circle segments 27 as well as of ten 90° segments 20. The stator side C1 consists of five conventional stator discs, which are mounted on a stator mount 29. The stator side C2 consists of fifteen conventional stator discs, which are attached to the second stator mount 30. The 90° rotor segments 20 are arranged in such a way that they pass only the stator discs on the stator side C2. By analogy to obtain a multi-linear characteristic curve of a trimmer the stator discs can also be designed as part segments.

Figure 8:
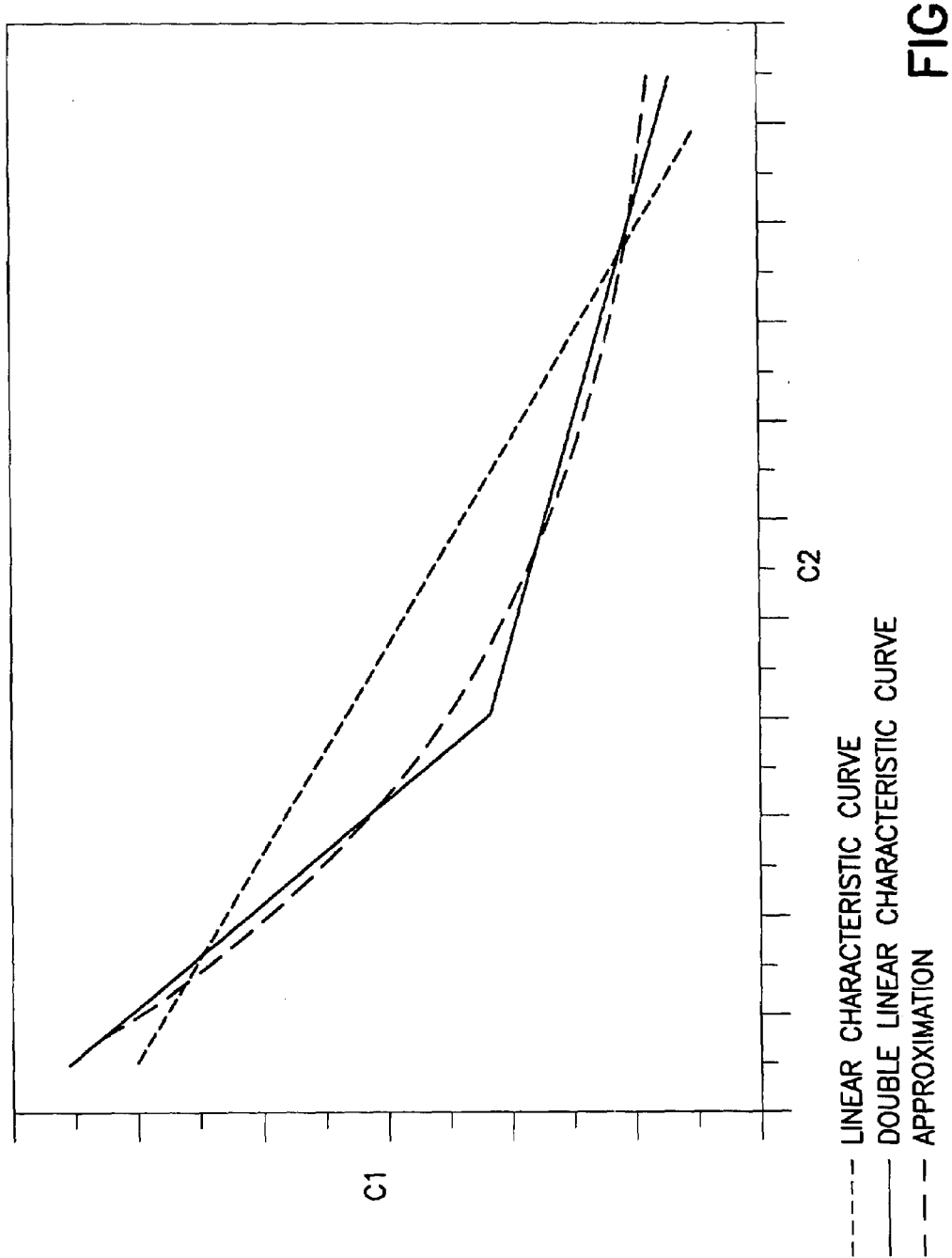
FIG. 8 is a graph showing the characteristic curve of linear and double linear characteristic curves.

In FIG. 8 the characteristic curve of a double linear differential air trimmer, i.e. the stator side C1 in dependency of stator side C2 is illustrated. The characteristic curve is composed of two lines with different slopes. With this double linear differential trimmer the illustrated non-linear dependency can be approached with increased accuracy, as compared to conventional trimmers with a linear characteristic curve.

FIGS. 9 and 10 show possible embodiments of high frequency air core inductive coils of this invention. They consist preferably of a metal pipe which is wound into a spiral (FIG. 9). This axis of this spiral can additionally be bend to form an arch (FIG. 10).

What is claimed is:

1. A high frequency matching network, comprising:
    a primary electrical circuit having first and second capacitors, wherein said second capacitor is a variable capacitor, and a primary high frequency air core inductive coil; and
    a secondary electrical circuit having a capacitor, a secondary high frequency air inductive coil and at least one excitation electrode, said primary and secondary circuits being selectively coupled by a coupling including an inductive coupling provided by an inductive flux of said primary and secondary air core inductive coils and a capacitive coupling provided by a capacitive means connected between said primary and secondary electrical circuits.

2. The network of claim 1, wherein said coupling between said primary and secondary electrical circuits is selectively adjustable between said inductive coupling and said capacitive coupling.

3. The network of claim 2, wherein said coupling is continuously adjustable between said inductive coupling and said capacitive coupling.

4. The network of claim 1, wherein said capacitive means comprises at least one fixed capacitor.

5. The network of claim 1, wherein said capacitive means comprises a variable capacitor.

6. The network of claim 1, wherein said capacitive means comprises a differential trimmer.

7. The network of claim 6, wherein said differential trimmer comprises a differential air trimmer having a stator and rotor, wherein at least one of said stator and rotor includes segmented discs to obtain a multi-linear characteristic curve.

8. The network of claim 1, wherein said variable capacitor of said primary circuit comprises a primary trimmer and said capacitor of said secondary circuit comprises a secondary trimmer, said primary and secondary trimmers being adjustable for matching a resonance frequency of the primary and secondary circuits to a generator frequency.

9. The network of claim 8, wherein a further fixed capacitor is connected in parallel with at least one of said primary trimmer and said secondary trimmer.

10. The network of claim 8, further comprising a vacuum boundary defining at least a portion of a vacuum chamber, wherein an entire portion of said secondary electrical circuit is arranged in the vacuum chamber, a mechanical vacuum feed through being connected to said secondary trimmer for adjustment of said secondary trimmer external of the vacuum chamber.

11. The network of claim 1, wherein said primary electrical circuit is dimensioned for obtaining large voltages and said secondary electrical circuit is dimensioned such that said large voltages of said primary electrical circuit generate large current amplitudes in said primary electrical circuit.

12. The network of claim 1, wherein said primary inductive coil comprises a number of windings in the range including 2-10 windings.

13. The network of claim 12, wherein said secondary inductive coil comprises less than two windings.

14. The network of claim 12, wherein said secondary inductive coil comprises one winding.

15. The network of claim 1, wherein each of said primary and secondary inductive coil comprises a diameter in the range including 10 to 100 mm.

16. The network of claim 1, further comprising a vacuum boundary defining at least a portion of a vacuum chamber, wherein at least said excitation electrode of said secondary electrical circuit is arranged in the vacuum chamber.

17. The network of claim 16, further comprising a vacuum current feed through for connecting the excitation electrode to the portion of the secondary electrical circuit arranged outside of the vacuum chamber.

18. The network of claim 1, further comprising a vacuum boundary defining at least a portion of a vacuum chamber, wherein an entire portion of said secondary electrical circuit is arranged in the vacuum chamber.

19. The network of claim 18, wherein said vacuum boundary comprises a dielectric window arranged between said primary and secondary inductive coils.

20. The network of claim 19, wherein said dielectric window is a non-magnetic and magnetic permeable material.

21. The network of claim 19, wherein said dielectric window is made of one of quartz glass and aluminum oxide.

22. The network of claim 1, further comprising a vacuum boundary defining at least a portion of a vacuum chamber, wherein, an entire portion of said secondary electrical circuit is arranged in the vacuum chamber, said capacitor of said secondary electrical circuit comprising a fixed capacitor.

23. The network of claim 22, wherein a resonance of the network is adjustable by one of varying the coupling between the primary and secondary inductive coils and adjusting the variable capacitor of said primary electrical circuit.

24. The network of claim 1, wherein said coupling is adjustable by varying the axial and radial distance of said primary and secondary inductive coils.

25. The network of claim 1, wherein said network comprises high frequency conducting components including said fixed capacitor, said variable capacitor, and said primary high frequency inductive coil of said primary circuit and said capacitor, said secondary high frequency inductive coil and said at least one excitation electrode of said secondary electrical circuit, at least one of said high frequency conducting components of said network is made of a non-noble metal with a low electric resistivity an outer surface and a layer of metal on the outer surface of the at least one of the high frequency conducting parts, said layer of metal comprising a metal including one of a gold and a platinum group metal.

26. The network of claim 25, further comprising a closed layer including a diffusion barrier deposited between said layer of metal and said at least one of the high frequency conducting parts.

27. The network of claim 25, wherein each of said high frequency conducting components is made of a non-noble metal with a low electric resistivity an outer surface and a layer of metal on the outer surface of the at least one of the high frequency conducting parts, said layer of metal comprising a metal including one of a gold and a platinum group metal.

28. The network of claim 1, wherein said network comprises high frequency conducting components including said fixed capacitor, said variable capacitor, and said primary high frequency inductive coil of said primary circuit and said capacitor, said secondary high frequency inductive coil and said at least one excitation electrode of said secondary electrical circuit, at least one of said high frequency conducting components of said network includes means for being cooled with a liquid medium.

29. The network of claim 1, wherein the network is used to generate a quasi neutral plasma beam.

30. The network of claim 1, wherein said network is used to generate an ion beam.

* * * * *